(12) United States Patent
Glenn et al.

(10) Patent No.: US 6,291,884 B1
(45) Date of Patent: Sep. 18, 2001

(54) CHIP-SIZE SEMICONDUCTOR PACKAGES

(75) Inventors: Thomas P. Glenn, Gilbert, AZ (US); Roy D. Hollaway, Paranaque (PH)

(73) Assignee: Amkor Technology, Inc., Chandler, AZ (US)

( * ) Notice: Subject to any disclaimer, the term of this patent is extended or adjusted under 35 U.S.C. 154(b) by 0 days.

(21) Appl. No.: 09/437,013

(22) Filed: Nov. 9, 1999

(51) Int. Cl.[7] ............................. H01L 23/48; H01L 23/52; H01L 29/40
(52) U.S. Cl. .......................... 257/747; 257/783; 257/778; 257/787; 438/108; 438/127
(58) Field of Search ..................... 257/686, 778, 257/747, 777, 787, 783; 438/108, 118, 125, 127

(56) References Cited

U.S. PATENT DOCUMENTS

| | | | |
|---|---|---|---|
| 5,148,265 | 9/1992 | Khandros et al. | 357/80 |
| 5,148,266 | 9/1992 | Khandros et al. | 357/80 |
| 5,155,661 | * 10/1992 | Nagesh et al. . | |
| 5,258,330 | 11/1993 | Khandros et al. | 437/209 |
| 5,398,863 | 3/1995 | Grube et al. | 228/106 |
| 5,641,995 | * 6/1997 | Sloma et al. . | |
| 5,672,545 | * 9/1997 | Trautt et al. . | |
| 5,969,417 | * 10/1999 | Yamashita et al. . | |
| 5,973,403 | * 10/1999 | Wark . | |
| 5,990,563 | * 11/1999 | Kim . | |
| 6,111,322 | * 8/2000 | Ando et al. . | |
| 6,121,686 | * 9/2000 | Togawa . | |
| 6,163,462 | * 12/2000 | Buck . | |

FOREIGN PATENT DOCUMENTS 2 276 9977 * 12/1994 (GB) .
2-125633 * 5/1990 (JP) .

* cited by examiner

Primary Examiner—S. V. Clark
(74) Attorney, Agent, or Firm—Skjerven Morrill MacPherson LLP; Don C. Lawrence

(57) ABSTRACT

A wafer-level method for mass production of surface-mounting, chip-size ("CS") ball grid array ("BGA"), land grid array ("LGA"), and lead-less chip carrier ("LCC") semiconductor packages includes the wire-bond or flip-chip attachment of ceramic substrates to the active surface of corresponding chips while they are still integral to a semiconductor wafer, thereby reducing manufacturing costs of the packages relative to that of individually packaged chips. The substrates have a thermal coefficient of expansion (TCE) closely matching that of the underlying chip. This eliminates the need for a silicone "interposer" between the substrate and the chip otherwise necessary to prevent stress-related problems caused by the difference in the respective thermal expansion and contraction of the chip and substrate with changes in temperature, further reducing the cost of the packages, improving heat transfer from the chips, and resulting in a package that is relatively free of thermal-induced stresses.

22 Claims, 10 Drawing Sheets

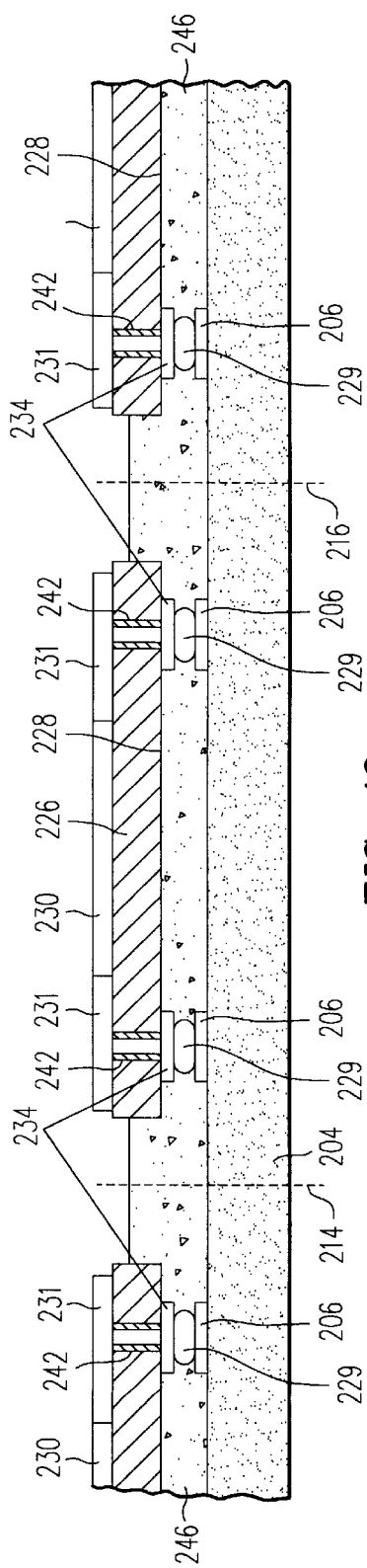
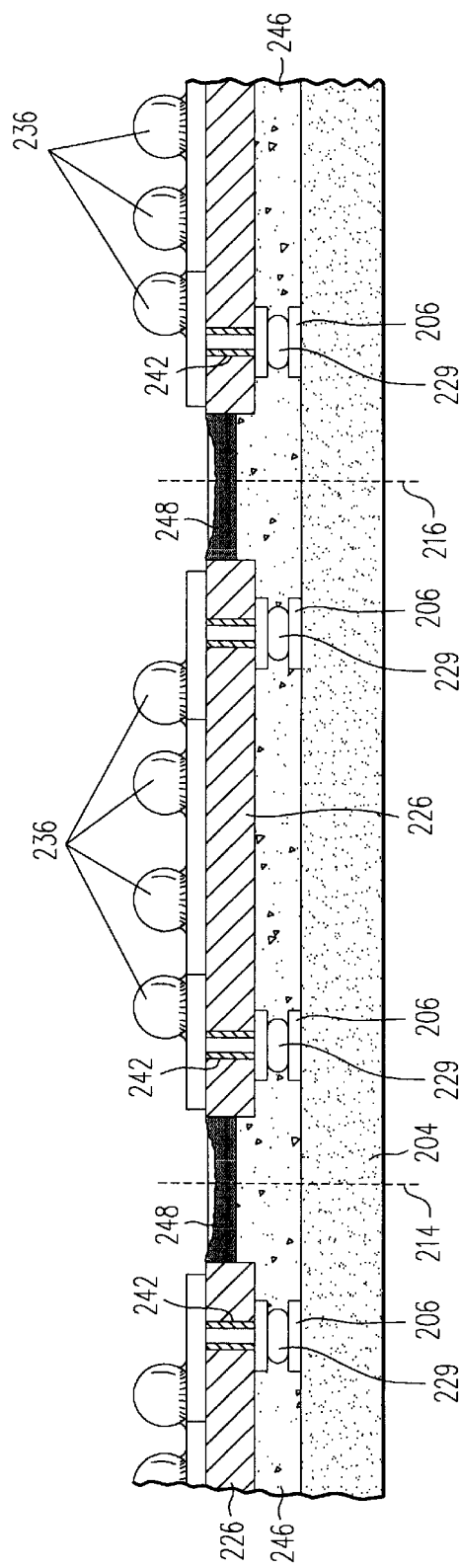

CHIP-SIZE SEMICONDUCTOR PACKAGES

BACKGROUND OF THE INVENTION

1. Field of the Invention

The present invention relates to semiconductor packages, and more particu- larly, to the production of chip-size ball grid array ("BGA"), land grid array ("LGA"), and lead-less chip carrier ("LCC") semiconductor packages.

2. Description of the Related Art

Currently, ball grid array ("BGA"), land grid array ("LGA"), and lead-less chip carrier ("LCC") packages for integrated circuit ("IC") dies, or "chips," are widely used in the semiconductor packaging industry. Because these types of packages use area array contacts instead of conventional perimeter leads, the physical size of relatively high-pin-count packages can be significantly reduced. However, the relatively large pitch size present in conventional BGAs, LGAs and LCCs requires large package bodies to accommodate applications having high input/output terminal (I/O) requirements. To further reduce the size of the packages and yet accommodate high I/O applications, so-called "chip-size," or "chip-scale" (as well as "near-chip-size," or "near-chip-scale") semiconductor packages, including BGA, LGA and LCC types of such packages, i.e., packages that are the same (or nearly the same) size as the IC chip packaged therein, have recently been developed. Indeed, a "rule-of-thumb" for characterizing the size of such packages has developed within the industry -packages that have the same area, or an area that is up to a maximum of 20% greater than that of the chip, are characterized as "chip-size," whereas, packages having an area that is more than 20% greater than the area of the chip are characterized as "near-chip-size."

In "Reliable BGAs Emerge In Micro Form," *Electronic Engineering Times* p. 104, 111 (September 1994), T. H. DiStefano discusses a near-chip-size, "micro-BGA" ("μBGA") type of package developed by Tessera, Inc. FIG. 1 is a cross-sectional view of a similar BGA package 11. In FIG. 1, an IC chip 10 has a plurality of bonding pads 12 on the margin of its upper surface. The bonding pads on the chip are connected to a plurality of metallizations, or conductive traces 16, on a flexible insulative substrate 14 (typically a polyimide resin tape) by electrical connectors 18. A conductive bump 20 is formed on each trace 16 to enable electrical connections between the μBGA 11 and other electrical components, e.g., a main, or "mother" board (not illustrated).

A compliant elastomeric layer, or "interposer," 15 is located between the chip 10 and the substrate 14. The layer 15 is attached directly to the face 22 of the chip 10 with, e.g., a layer of a silicon-based adhesive 19. The chip 10, in turn, is bonded to a "thermal spreader" 26 using a layer of adhesive 24. The connectors 18 are encapsulated with a flexible, protective resin (silicone) envelope to complete the fabrication of the μBGA package 11. Various examples of such types of packages may be found in U.S. Pat. Nos.: 5,398,863 to G. W. Grube et al.; 5,258,330 to I. Y. Khandros et al.; 5,148,266 to I. Y. Khandros et al.; and, 5,148,265 to I. Y. Khandros et al.

Importantly, in such conventional packages, the elastomeric layer 15 serves to compensate for the large difference in the respective thermal coefficients of expansion (TCE) of the chip 10 and the substrate 14. Such compensation is necessary because the substrate 14, which is typically formed of a flexible polyimide (e.g., Capton) tape or film (TCE ≈15–18 parts-per-million per degree Centigrade (PPM/° C.)), experiences a much greater amount of thermal expansion and contraction with heating and cooling, respectively, than does the chip 10, which is typically made of silicon (TCE=4 PPM/° C.) or other semiconductor material. By accommodating the TCE mismatch, the elastomeric layer 15 provides protection against stress-related problems in the packages, such as warping and solder ball cracking, caused by this disparity. However, the elastomeric layer 15 also comprises an additional element in the package and involves additional processing steps in the fabrication thereof, which not only increases both the cost and the thickness of the package, but reduces its heat transfer capabilities, as well.

Also of importance, the chip 10 is typically sawn from the semiconductor wafer in which it is formed before it is incorporated into the conventional BGA package 11. In a conventional fabrication process, many identical chips are integrally formed simultaneously in a semiconductor wafer using known photolithography techniques. Each individual circuit is tested while still integral to the wafer, and defective chips are inked or otherwise electronically marked as such. Each chip is then cut from the wafer, the defective chips are discarded, and the good chips are incorporated into individual packages. However, processing each chip individually increases the amount of handling required, and hence, packaging costs.

It is therefore desirable to simplify the manufacturing process and reduce the packaging costs of such packages by developing a wafer-scale packaging process wherein a plurality of chips are simultaneously packaged while still joined together in a wafer, i.e., before they are separated from it. It is further desirable to simplify BGA, LGA and LCC package manufacture by eliminating the need for an additional elastomeric layer to accommodate the TCE mismatch between the chip and its substrate, yet do so in a package that is not subject to temperature-related stress problems. It is also desirable to reduce the size of the packages to that of the chip itself.

BRIEF SUMMARY OF THE INVENTION

This invention provides a wafer-level manufacturing process for fabricating chip-size BGA (CS-BGA), LGA (CS-LGA) and LCC (CS-LCC) semiconductor packages that are immune to temperature-induced stress problems without need for an elastomeric interposer.

In one preferred embodiment of the invention, the bottom surface of a rigid, electrically insulative substrate is mounted to the top surface of a chip in a semi-conductor wafer by means of an adhesive. Importantly, the material of the substrate is chosen such that its TCE is the same, or nearly the same, as that of the underlying chip.

In this first embodiment, the substrate has an area that is somewhat less than that of the chip, and is mounted in the center of the chip such that its edges are inboard of the edges of the chip to expose bonding pads on the periphery of the underlying chip. By mounting the rigid substrate such that the first terminals are confined within the area of the chip, the resulting BGA, LGA or LCC package is "chip sized," i.e., has an area substantially equal to that of the chip itself.

In the first embodiment, first terminals of conductive traces, preferably copper or tungsten, either thick-film or thin-film, which are formed on the top surface of the substrate, are then electrically connected to corresponding conductive pads on the periphery of the top surface of the chip by fine, conductive bonding wires. After wire bonding, the regions containing the first terminals on the substrate, the pads on the chip, and the bonding wires are encapsulated with a protective epoxy resin, which is accomplished by dispensing a bead of epoxy having a relatively high viscosity over the pads on the chip, the bonding wires and the first terminals on the substrate to completely cover them, then curing the encapsulant.

In a second, so-called "flip-chip" embodiment, the bottom surface of a rigid, electrically insulative substrate is mounted on the top surface of the chip. As in the first, wire-bonded embodiment, the material of the substrate is chosen such that its TCE is the same, or nearly the same, as that of the underlying chip.

First conductive terminals formed on the bottom surface of the rigid substrate are then electrically connected directly to corresponding conductive pads on the top surface of the chip by fusing balls of a conductive metal disposed between the first terminals and the pads, which also serves to attach the substrate to the chip mechanically. Protective encapsulation is accomplished by dispensing a quantity of liquid epoxy. "underfill" having a relatively low viscosity around the edges of the chip and the substrate, where it is drawn into the narrow space between the chip and the rigid substrate by capillary forces to seal the active surface of the chip and the flip-chip solder interconnections extending between the chip and the substrate.

In the flip-chip embodiment, the substrate has an area that is only slightly less than that of the chip, and is mounted on the chip such that its edges are nearly flush with the edges of the chip. Thus, in this embodiment, the first terminals, which are located on the bottom surface of the substrate, are also confined within the area of the chip, and a chip-size package also results.

To enable interconnection of the novel CS-BGA package to other electrical components, e.g., a main board, a plurality of interconnecting solder balls are respectively formed on second terminals of the conductive traces. In both the first and second embodiments described above, the second terminals are located on the top surface of the substrate, and in the second, flip-chip embodiment, a conductive path is formed through the thickness of the substrate between respective ones of the first and second terminals.

In the novel CS-LGA and CS-LCC packages, the solder balls are omitted, and interconnection of the package with other components, e.g., a main board, is effected by fusing a solder paste or solder ball disposed between lands or pads on the top surface of the substrate and corresponding lands or pads on the main board.

In accordance with the invention, the packages can be fabricated while the chips are still in the wafer form, i.e., before the chips are cut from the wafer. This advantageously reduces the amount of handling necessary to form the packages, which, in turn, reduces their manufacturing cost. Further, by closely matching the TCEs between the rigid substrate and the chip, not only are temperature-induced stress problems eliminated, but the need for a complaint elastomeric layer used in conventional ILBGAs is also eliminated, thereby further reducing manufacturing costs and improving heat transfer from the chip.

These and other features and advantages of the present invention will become more readily apparent from the detailed description of the preferred embodiments thereof set forth below, particularly if considered in conjunction with the accompanying drawings.

BRIEF DESCRIPTION OF THE SEVERAL VIEWS OF THE DRAWINGS

FIGS. 16–19 are sequential cross-sectional elevation views of the wafer shown in FIG. 5 similar to the view shown in FIG. 6, showing the fabrication thereon of the wire-bonded CS-BGA package of the present invention at various stages of its fabrication;

DETAILED DESCRIPTION OF THE INVENTION

Figure 1:
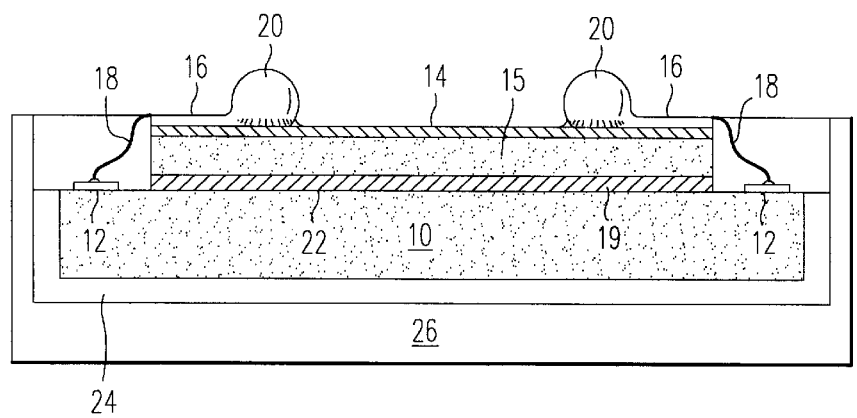
FIG. 1 is a cross-sectional view of a μBGA package in accordance with the prior art.
Figure 2:
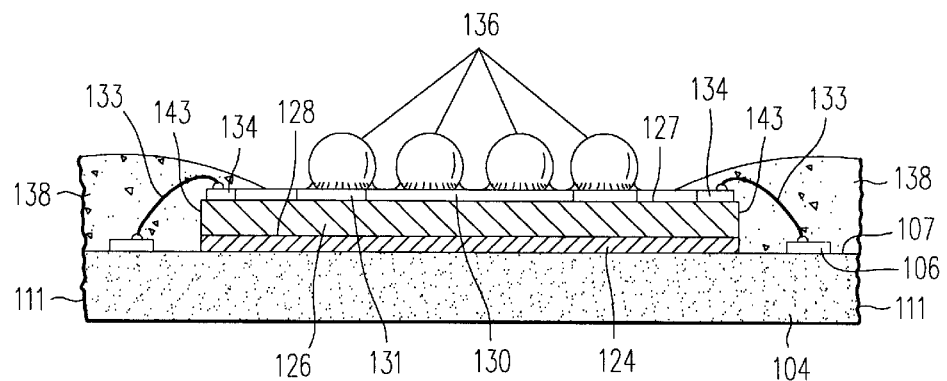
FIG. 2 is a cross-sectional elevation view of a wire-bonded CS-BGA package in accordance with the present invention.
Figure 4:
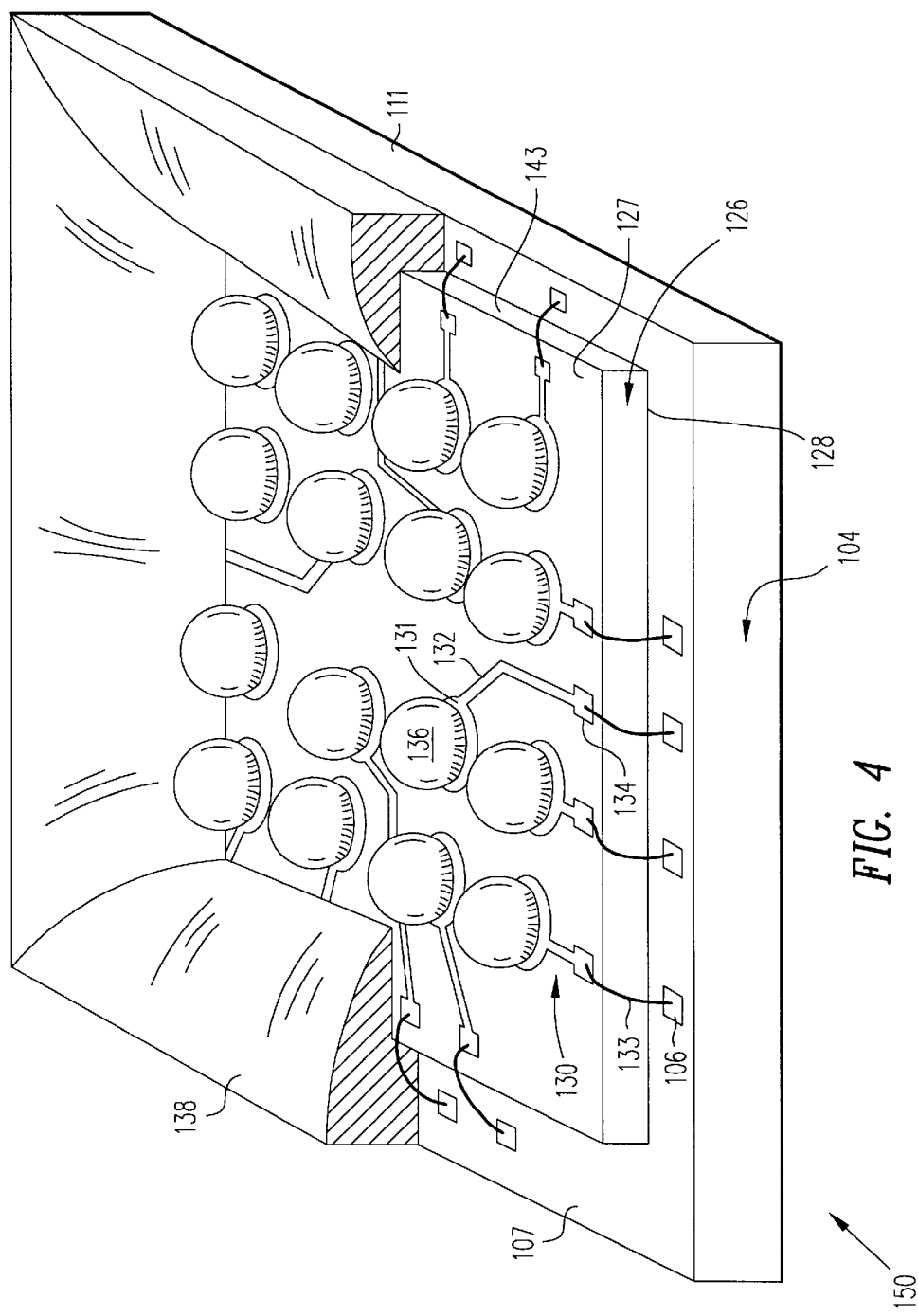
FIG. 4 is a perspective view partially in section of the wire-bonded CS-BGA package of FIG. 3.

FIGS. 2 and 4 illustrate, in cross-sectional and perspective views, respectively, a preferred embodiment of a wire-bonded CS-BGA package 150 of the present invention. The package includes a chip 104 having a plurality of conductive bonding pads 106 formed on a top surface 107 thereof. The bonding pads are electrically connected to the internal electronic components of the chip 104 and are arranged in rows adjacent to the edges 111 of the chip 104.

The bottom surface 128 of a rigid substrate 126 is bonded to the top surface 107 of the chip 104, for example, by use of a suitable adhesive 124. As shown in FIG. 2, the rigid substrate 126, which is fabricated to have an area slightly less than the area of the chip 104, is located at the center of the chip 104 in a plane generally parallel to the top surface thereof, such that the substrate 126 does not cover the bonding pads 106 located on the margins of the chip, yet is large enough to accommodate an array of solder balls 136 (see FIG. 4).

The rigid substrate 126 is provided in the form of a "coupon" of a fairly rigid, electrically insulating material, for example, a ceramic, silicon oxide, gallium arsenide ("G.A.S.") quartz, alumina, aluminum nitride ("AIN"), or a low-TCE laminate of one or more layers of the above rigid substrate materials that are available from, e.g., the NTK Technical Ceramics Division of NGK Spark Plugs (U.S.A.), Inc., Irvine, Calif. The range of thickness of a typical rigid substrate 126 is from about 0.3 millimeters ("mm") to about 0.65 mm.

Importantly, the material of the rigid insulating layer 126 is selected to have a thermal coefficient of expansion (TCE) very close to that of the chip, which is typically made of silicon, having a TCE of about 4 parts-per-million per degree Centigrade ("PPM/° C."). Thus, rigid substrate 126 ceramic materials suitable for use in connection with silicon chips in the present invention include a 98% alumina (TCE=5 PPM/° C.), AlN (TCE=4.5 PPM/° C.), silicon carbide (TCE=4 PPM/° C.), and a "laminate" structure of one or more of the foregoing materials (TCE≈6 PPM/° C.). Generally speaking, the larger the area of the chip, the more important it is that the TCE of the substrate 126 match that of the chip. For example, a silicon chip 104 that is less than or equal to about 0.25" (6,222 μ) on a side can tolerate a substrate 126 having a TCE of from about 4–7 PPM/° C., whereas, a chip larger than that conservatively requires a substrate having a TCE of from about 4–6 PPM/° C.

It has been discovered that, provided the material of the rigid, insulative substrate 126 is selected such that its TCE is equal to that of the material of the underlying chip, plus or minus about 2.5 PPM/° C., then the stress-related problems of the prior art packages caused by the large difference in the respective amounts of thermal expansion and contraction experienced by the substrate 126 and the chip 104 with heating and cooling is virtually eliminated, in that the substrate and the chip expand and contract with each other at the same rate and in the same amount. Consequently, the need for a compensating layer, such as the silicone "interposer" of the prior art μBGA described above, is also eliminated, and the chip 104 and the substrate 126 can be attached directly to each other, thereby reducing both fabrication costs and the thermal resistance between the chip 104 and the substrate 126.

The rigid substrate 126 has a plurality of conductive traces 130 formed on its top surface 127. (For clarity, only a few traces 130 are shown in the figures. However, it should be understood that, typically, a relatively large number of such traces are present, depending upon the particular I/O requirements of the device.) Each conductive trace 130 has a contact terminal 131, a partial lead 132 (see FIG. 4) and a bonding terminal 134 formed integral to one another. The bonding terminals 134 are arranged in rows adjacent to the edges 143 of the rigid substrate 126 to match corresponding ones of the bonding pads 106 on the underlying chip 104. The traces 130 are formed from an electrically conductive material, preferably copper, tungsten, gold, platinum, silver, or any bondable metal compound. Copper may be used on ceramics that are fired at a relatively low temperature, whereas, tungsten that is subsequently plated with gold is preferably used on AlN and other ceramics that are fired at relatively high temperatures. The traces 130 may be formed using conventional methods, for example, by photolithography techniques, by thick/thin film technology, or by silk screening.

In a CS-BGA package, interconnecting solder balls 136 are formed on each contact terminal 131 using conventional bump-forming methods. The interconnecting balls 136 enable interconnections to be made between the CS-BGA package 150 and other electrical components, e.g., a main printed circuit board (not illustrated) using, e.g., conventional reflow methods.

LGA and LCC packages interconnect with other components such as a main board by fusing a solder paste or ball disposed between lands or pads on the top surface 127 of the substrate 126, analogous to the contact terminals 131 illustrated in the figures, and corresponding lands or pads on the main board (not illustrated). Thus, although the fabrication of CS-BGA packages 150 is described and illustrated herein for illustrative purposes, it should be understood that, except for the provision of the solder balls 136 on the package 150, the fabrication of CS-LGA and CS-LCC packages in accordance with the present invention is substantially similar to that described and illustrated herein for the novel CS-BGA packages.

In the exemplary wire-bonded CS-BGA embodiment 150 illustrated in FIGS. 2 and 4, each bonding terminal 134 is electrically connected to a corresponding bonding pad 106 by a fine conductive bonding wire 133 using conventional wire bonding techniques, for example, gold-ultrasonic, aluminum-ultrasonic or gold-thermocompression techniques. However, in certain applications, such as high power applications, it may be preferable to use a flat, conductive ribbon-bonding method of electrical connection of the chip 104. (An alternative, "flip-chip" method of electrically connecting the chip 104 to the substrate 126 is described below in connection with a second preferred embodiment of the invention.)

After wire bonding, the bonding pads 106, bonding wires 133 and bonding terminals 134 are encapsulated within a protective epoxy resin envelope by dispensing a bead 138 of the material from the nozzle of a pressure dispenser along the margins of the chip 104 and substrate 126. The encapsulant is applied in a relatively viscous, or "stiff," condition such that it does not slump, or flow laterally, to an extent sufficient to expose any of the encapsulated components. In extremely "tight" configurations, a dam (not illustrated) can be positioned between the contact terminals 131 and the bonding terminals 134 to stop the lateral flow of the encapsulant 138.

The bead of encapsulant 138, which is typically about 0.020–0.030 inches in height above the upper surface 127 of the substrate 126, seals, protects, and insulates the bonding pads 106, bonding wires 133, bonding terminals 134 and their associated interconnections from harmful environmental elements, and also isolates them electrically from each other. In combination with the substrate 126 and the layer of adhesive 124, it also serves to protect the upper, "active" surface 107 of the chip 104 against penetration by damaging moisture. For purposes of illustration, a portion of the bead of encapsulant 138 is cut away in FIG. 4. However, it should be understood that the bead of encapsulant 138 is applied along the entire periphery of the chip 104 and the rigid substrate 126, and covers all of the bonding pads 106, bonding wires 133 and bonding terminals 134 of the adjacent chips. In accordance with the present invention, the resulting CS-BGA package 150 is the same size as the chip 104, i.e., it is "chip-sized," in that its overall area is equal to that of the chip.

Figure 5:
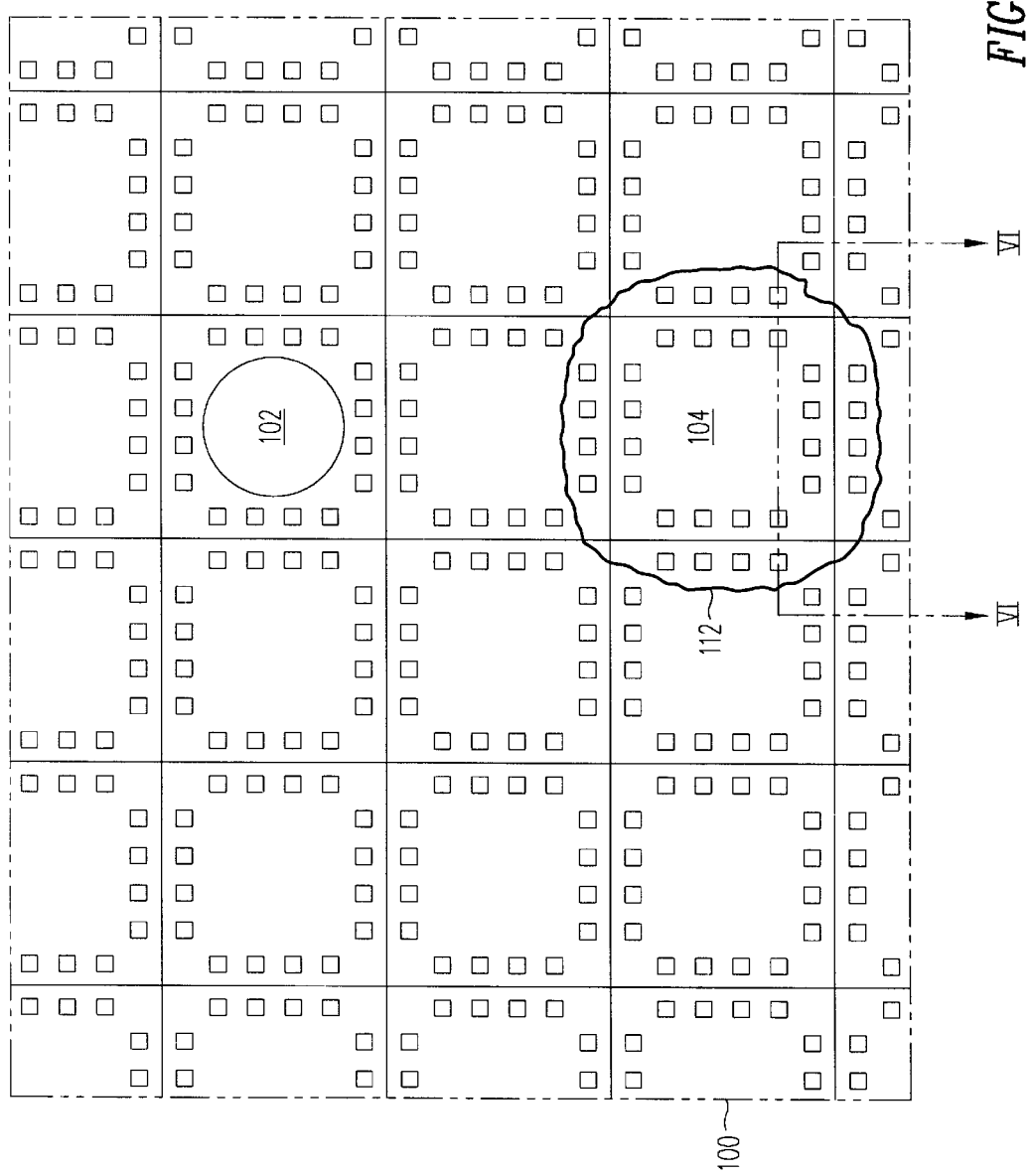
FIG. 5 is a plan view of a portion of a semiconductor wafer having a plurality of dies formed therein and from which a plurality of CS-BGAs, CS-LGAs, or CS-LCCs of the present invention are fabricated.

FIG. 5 is an enlarged plan view of a rectangular portion 100 of a semi-conductor wafer having a plurality of dies, or chips, 104 formed therein. It should be understood that a semiconductor wafer from which such a portion 100 is taken is typically round, has a diameter ranging between about 4–8 inches (although wafers up to about 12 inches in diameter are currently being developed), and may include from less than a dozen to more than a hundred such chips 104 in it. In the embodiment illustrated in FIG. 5, one of the chips 102 has been marked with a circle to indicate that it is defective. As used hereinafter, "chip" generally refers to a die or chip that is still integral with the wafer, i.e., before it has been cut (or "singulated") therefrom. As shown in FIG. 5, a single chip 104 is formed within each of the regions 112. Fabrication of chips on a semiconductor wafer, testing of the chips, and marking of defective chips, are well known to those skilled in the semiconductor manufacturing art.

FIGS. 6–10 illustrate in cross-section the sequential stages in the formation of a wire-bonded CS-BGA package 150 within the region 112 of the wafer in accordance with this invention. Although the formation of a single CS-BGA is described for clarity, it should be understood that in the preferred method of this invention, every known good die ("KGD") on a wafer is similarly and simultaneously processed at each stage.

Figure 6:
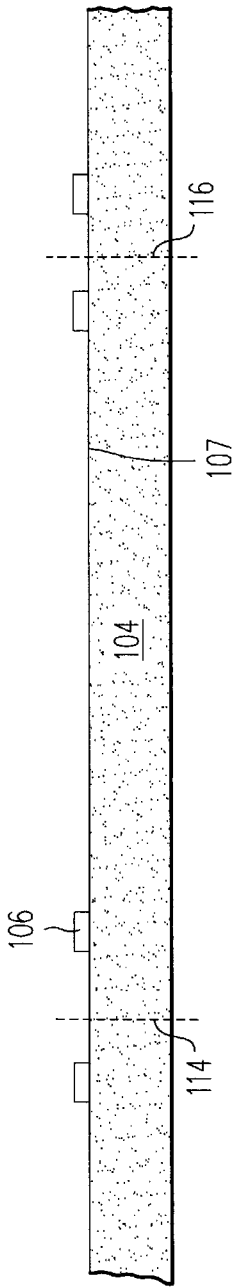
FIG. 6 is a cross-sectional elevation view of the wafer shown in FIG. 5, as revealed by the section taken along the lines VI—VI therein.

FIG. 6 illustrates a cross-sectional view of the chip 104, and in particular, that of the region 112 in FIG. 5. The chip 104 has a top surface 107 with a plurality of bonding pads 106 around its periphery.

Figure 9:
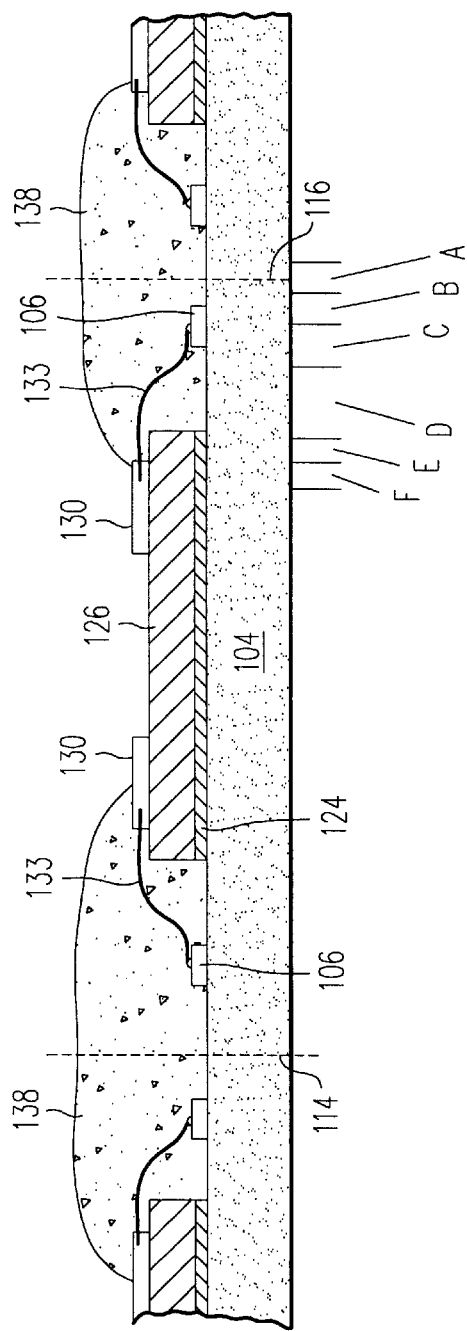
Figure 10:
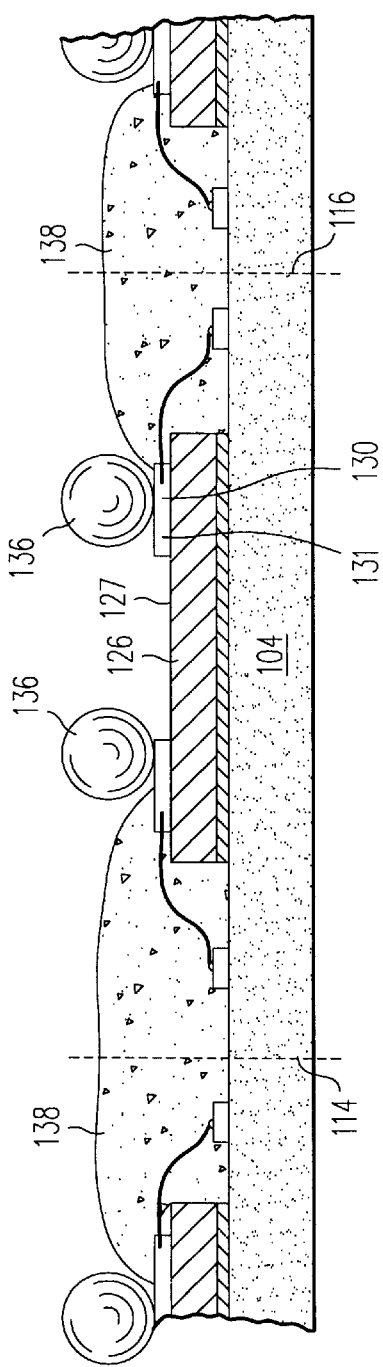
Figure 11:
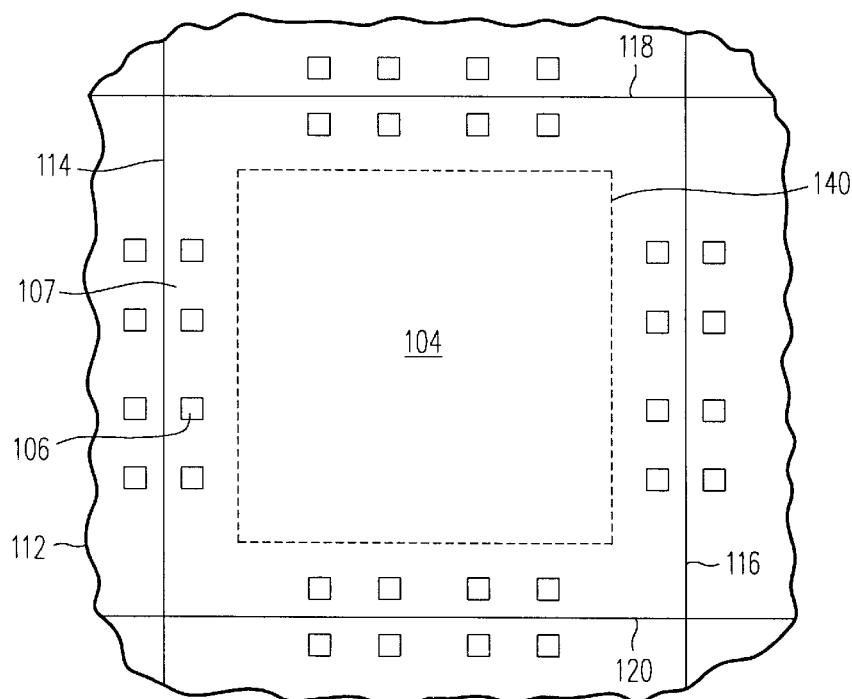
FIGS. 11–15 are sequential plan views corresponding respectively to the cross-sectional elevation views of FIGS. 6–10 of the wafer shown in FIG. 5, showing the fabrication thereon of the wire-bonded CS-BGA package at various stages of its fabrication; and, FIGS. 16–19 are sequential cross-sectional elevation views of the wafer shown in FIG. 5 analogous to the cross-sectional views shown in FIGS. 6–10, except showing the fabrication thereon of the flip-chip CS-BGA package of the present invention at various stages of its fabrication.

As shown in FIGS. 11–15, which are plan views of the region 112 corresponding respectively to the sequential cross-sectional views in FIGS. 6–15, the chip 104 is bounded on all four sides by two sets of parallel scribe lines, or "streets," 114, 116, 118 and 120, that extend across the entire width of the wafer and intersect each other orthogonally, and which are typically formed in the wafer by photolithography during wafer fabrication. In the cross-sectional views of FIGS. 6–10, the regions underlying the scribe lines 114, 116 around the chip are shown as the dotted lines 114, 116. As shown in FIG. 11, the top surface 107 of the chip has a central area 140 shown by dashed lines located inboard of the bonding pads 106 disposed on the periphery of the chip.

In conventional semiconductor manufacturing, after the chips 104 are completely defined in the wafer, the wafer is cut along the scribe lines to form individual chips, which are then segregated into at least two groups, defective dies and KGDs. The former are typically discarded, while the latter are routed on to be individually packaged using conventional techniques, such as described above in connection with the conventional μBGA package.

The present invention departs from this conventional scenario, however, in that the CS packages 150, each incorporating a chip 104, are completely formed on the wafer in the process described below before being separated from the wafer into individual, fully formed packages. This latter separation process, sometimes referred to as "singulation," is typically accomplished by sawing through the wafer along the scribe lines 114, 116, 118 and 120 to separate the individual CS packages from the wafer and each other. Since the sawing process is typically effected with a saw that is automatically guided and aligned by optical pattern recognition equipment that optically tracks the scribe lines, it will be understood that it is important to leave at least an end portion of each of the scribe lines 114, 116, 118 and 120 visible on opposite sides of the wafer at its periphery so that the optically guided saw can accurately separate the packages from the wafer after fabrication is complete.

Figure 7:
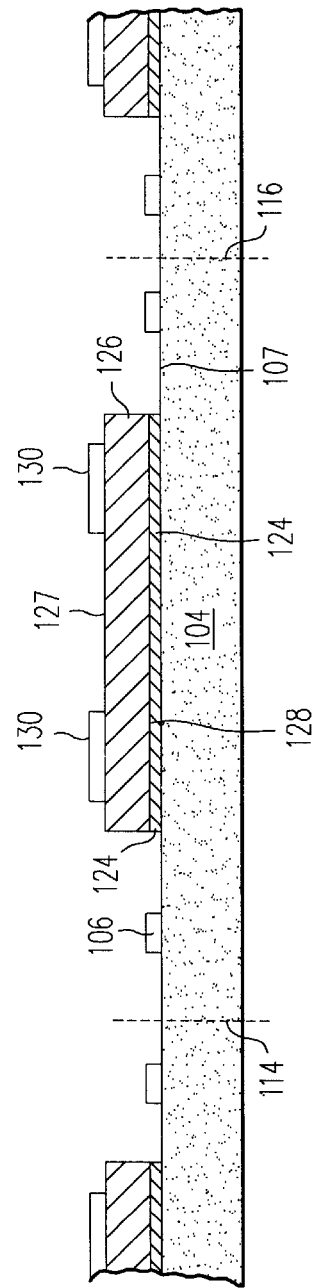
Figure 12:
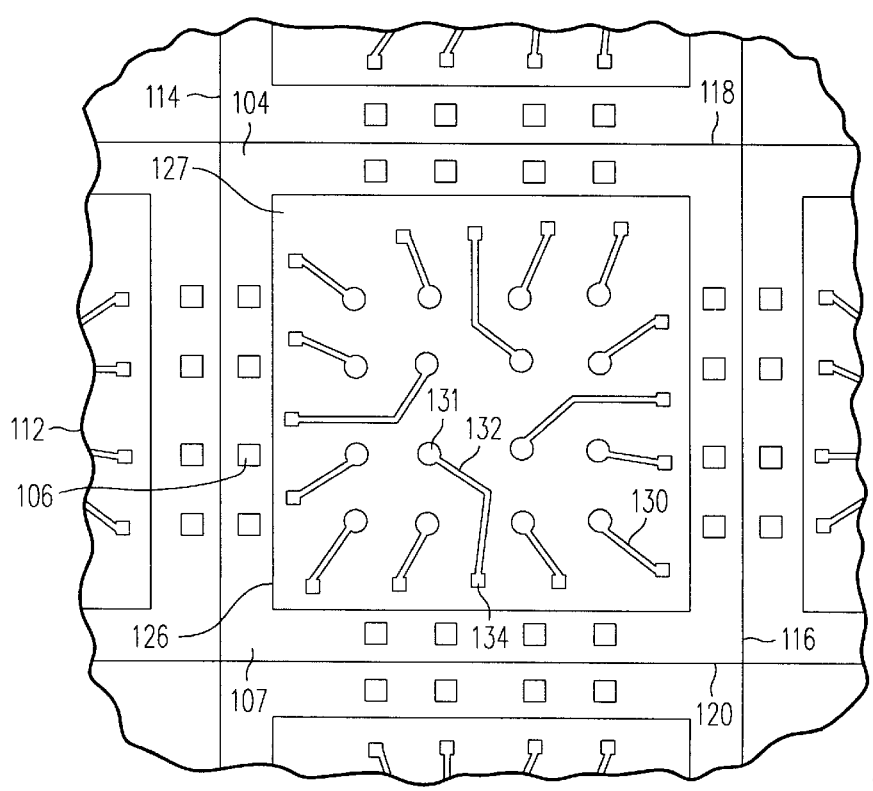

FIGS. 7 and 12 are cross-sectional and plan views, respectively, of the CS-BGA package 160 at the next stage of its manufacturing process. As shown in FIG. 7, a bottom surface 128 of a rigid substrate 126 is bonded to the top surface 107 of the chip 104 by layer 124 of a suitable adhesive, for example, an epoxy adhesive such as QMI-536, available from Quantum Materials, Inc., of San Diego, Calif. In one embodiment, the adhesive is first applied to the top surface 107 of the chip 104, and the rigid substrate 126 is then put in place on top of the chip. In an alternative embodiment, the adhesive is first applied to the bottom surface 128 of the rigid substrate 126, and the substrate 126 then placed, adhesive side down, on the top surface 107 of the chip 104.

Those of skill in the art will recognize that the process of attachment of the substrates 126 to the wafer is analogous to the prior art attachment of individual chips to flexible tape substrates, and indeed, is amenable to the same automated "pick-and-place" die-attach equipment frequently employed in the latter process, such as the MRSI-375 die-attacher available from MRSI of Chelmsford, Mass., or equivalent. Such equipment is capable not only of dispensing the adhesive on the chip 104 or substrate 126 in the precise amount needed, and then placing the substrate on the chip rapidly and accurately, but is also capable of distinguishing known defective chips in the wafer, and omitting to populate such chips with a substrate, thereby avoiding needless and wasteful processing of defective chips, all with a minimum of human intervention and/or supervision.

When the substrates 126 are all in place on respective ones of their associated chips 104, the layer of attachment adhesive 124 is then cured, typically by heating the entire wafer in an oven, thereby bonding the rigid substrates 126 permanently to their respective chips 104, as shown in FIGS. 7 and 12.

Figure 8:
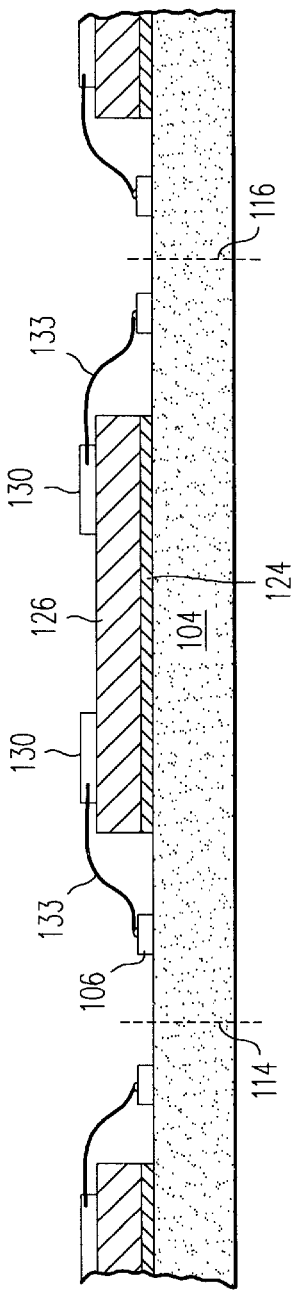
Figure 13:
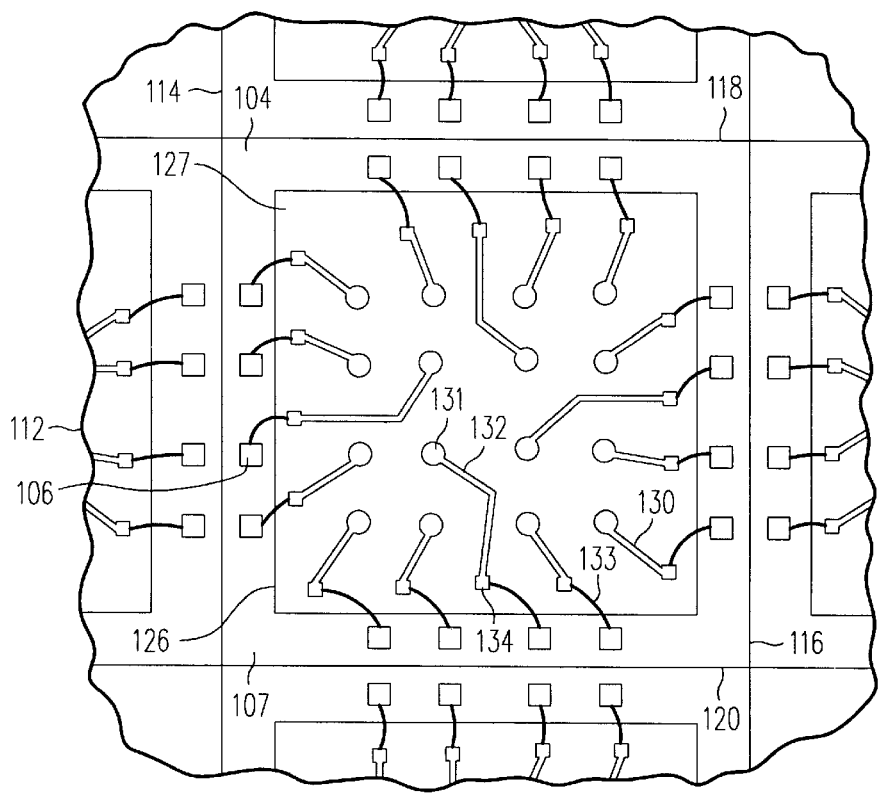

Referring to FIGS. 8 and 13, a plurality of metallizations, or conductive traces 130, are formed on the top surface 127 of the rigid substrate 126. As shown in FIGS. 11–13, the rigid substrate 126 is located in central area 140 of the chip 104, i.e., the edges of the substrate are set back such that they do not extend over the bonding pads 106 located around the periphery of the top surface 104 of the chip. Consequently, the substrate 126 must have an area somewhat less than the area of the chip 104.

Each conductive trace 130 has a contact pad or terminal 131, a partial lead 132, and a bonding terminal 134 formed integral to one another. Each bonding terminal 134 on the substrate 126 is electrically connected to a single bonding pad 106 on the chip 104 by a conductive bond wire 133, typically by a 0.001–0.0013" diameter gold wire, using conventional wire bonding techniques, which results in the structure shown in FIGS. 8 and 13. Examples of suitable wire bonding techniques include gold-ultrasonic, aluminum-ultrasonic and gold-thermocompression techniques. Examples of suitable wire bonders would include wire-bonder model nos. AB-356 or AB-559 from ASM, Inc., of Hong Kong. And, as described above in connection with the attachment of the substrates to the wafer, the wire bonding process can be performed over the entire surface of the wafer with automated, optical pattern recognition equipment that is capable not only of precise, rapid bonding of every terminal-pad pair on the wafer, but also of recognizing, and omitting any. wire bonding to, known defective chips, thereby avoiding needless waste of manufacturing resources.

Figure 14:
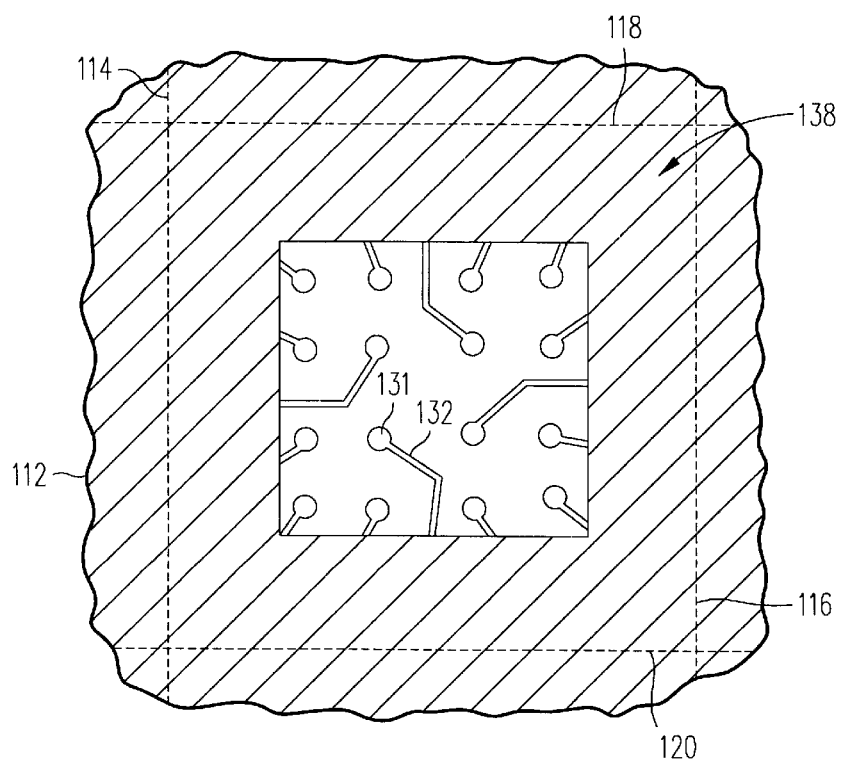

The next stage in the method of the invention is the encapsulation of the bonding pads 106, the bonding wires 133, and the bonding terminals 134 in a protective resin envelope 138, as is shown in the cross-sectional and plan views of FIGS. 9 and 14, respectively. Encapsulation is accomplished by dispensing a bead of a relatively viscous stage of an epoxy resin, preferably Hysol 4451, available from Dexter, Inc., City of Industry, California, from the nozzle of a pressure dispenser along the scribe lines 114, 116, 118 and 120 to fill the space between adjacent substrates 126 and form a mound of the encapsulant 138 between them, and then curing the encapsulant in place, e.g., an oven cure. The mound of encapsulant 138 defines a protective envelope that completely encloses and seals the bonding pads 106, bonding wires 133, the periphery of the rigid substrate 126, and the bonding terminals 134. As discussed above, however, it is important that at least an end portion of each of the two sets of orthogonal scribe lines 114, 116, 118 and 120 be left visible, i.e., uncovered by the encapsulant 138, on opposite sides of the wafer, respectively, so that a saw that optically tracks the scribe lines can accurately separate the packages from the wafer during package singulation.

The amount of epoxy needed for effective encapsulation depends upon the design of the particular die. The following example is provided by way of illustration. Referring to FIG. 9, in a case where: (A) The scribe line 116 is 3 mils wide (1 mil=$\frac{1}{1000}$ inch); (B) the distance between the scribe line 116 and the bonding pad 106 is 1 mil; (C) the bonding pad 106 is 4 mils wide; (D) the distance between the rigid substrate 126 and the bonding pad 106 is 4 mils; (E) the bonding terminal 134 is formed 1 mil from the edge of the substrate 126; and, (F) the bonding terminal 134 has a width of 4 mil; then the width of the encapsulant layer 138 on die 104 is at least 14 mils (B+C+D+E+F). However, since the epoxy must overflow slightly to encapsulate adjacent chip edges, the width of the epoxy bead should be approximately twice the width needed for a single die, plus the width of the scribe line. In the above illustration, enough epoxy should be applied to form an epoxy mound that is at least 31 mils wide (14 mils for each die, plus 3 mils for the scribe line).

In an automated production line, the mound of epoxy encapsulant 138 can be dispensed by an automated, pump-fed dispenser such as the Camalot Xyflex from Speedline Technologies, Franklin, Mass.; Asymtec dispensers, available from EMAT Systems, Englewood, CO.; and the MRSI model 170 from MRSI, Chelimsford, Mass.

Figure 15:
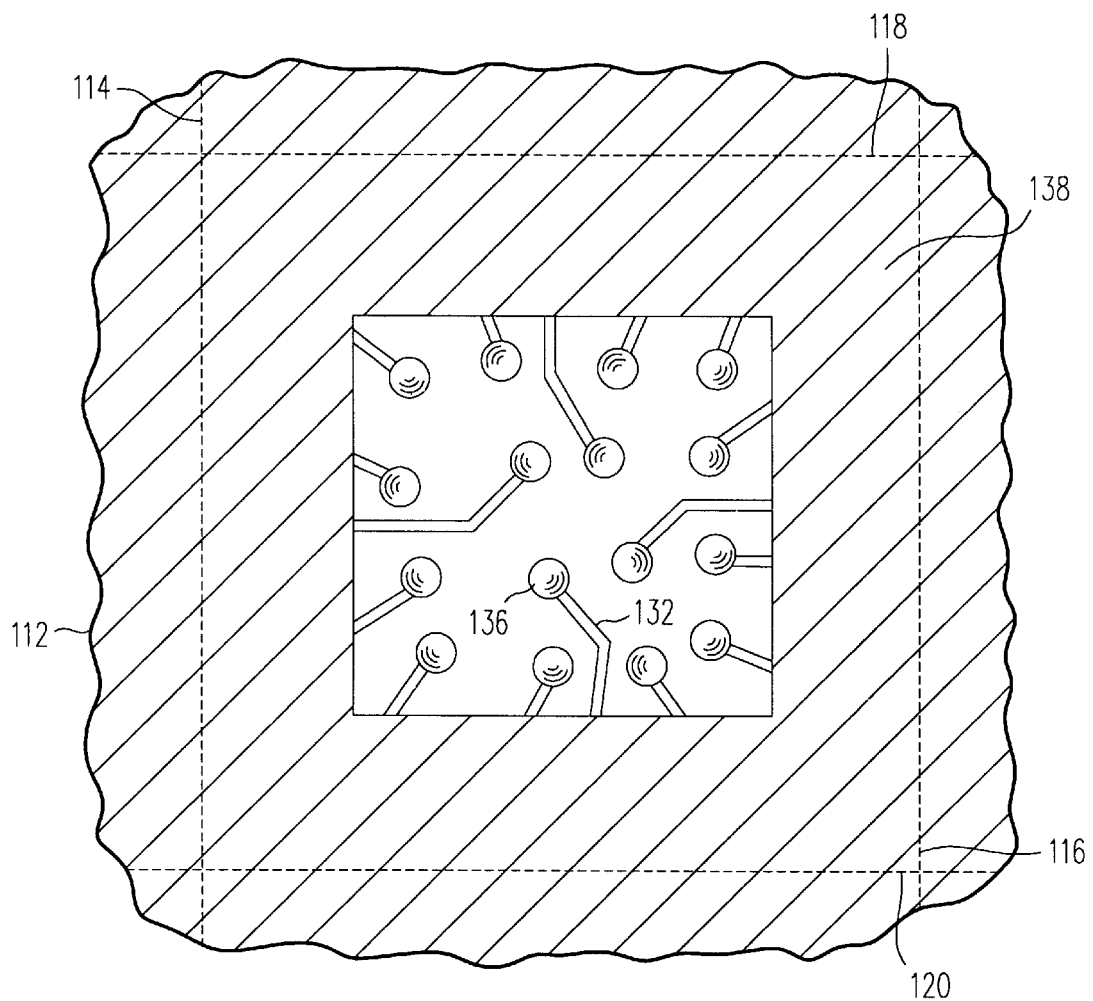

FIGS. 10 and 15 are cross-sectional and plan views, respectively, of the wire bonded CS-BGA package 150 during the next stage of the manufacturing process. As shown here, interconnecting solder balls 136, typically eutectic solder, are formed on each contact terminal 131 using conventional methods, for example, infrared reflow soldering of a solder paste applied by silk screening or by an automatic solder paste dispenser of a type available from, e.g., Camalot Division of Speedline Technologies. As discussed above, the fabrication of CS-LGA and CS-LCC packages in accordance with the present invention is substantially similar to that described and illustrated above for the novel CS-BGA packages, except that the step of forming solder balls 136 on the contact terminals is omitted.

After the solder balls 136 have been attached to the top surface 107 of the substrate 126, the wafer and encapsulant 138 are then cut through along the scribe lines 114, 116, 118 and 120, typically in a sawing process as described above, to "singulate" the individual CS-BGAs 150 illustrated in FIG. 2 from the wafer and from each other. This process may be effected in a manner similar to that used in the prior art for separating individual chips from a semiconductor wafer. For this purpose, a blue, wafer-mounting tape (available from, e.g., Nitto Denko Corp. of Japan) that is conventionally used to hold a semiconductor wafer while it is being cut into individual dies, or chips, can be used to hold the bottom surface of the wafer while it and the thickness of the encapsulant 138 are being simultaneously cut to define the individual packages 150. The wafer and the encapsulant 138 are both sawn through down to, but not through, the blue mounting tape along the scribe lines 114, 116, 118, 120, such that the individual packages 150 remain attached to the mounting tape in their respective original positions after cutting.

Figure 3:
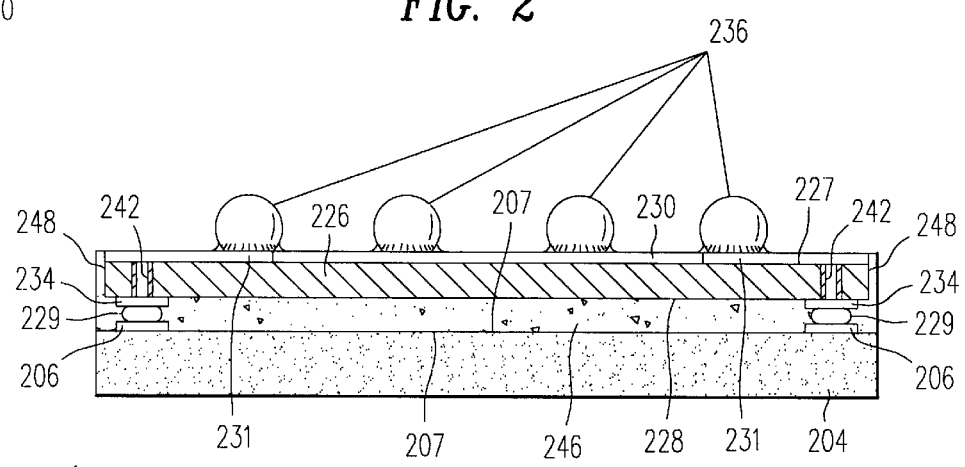
FIG. 3 is a cross-sectional elevation view of a flip-chip embodiment of a CS-BGA package in accordance with the present invention.

The sequential steps in the process of manufacturing a flip-chip embodiment of a CS-BGA, CS-LGA and CS-LCC package 200 in accordance with the present invention, such as the CS-BGA package 200 illustrated in cross-section in FIG. 3, is illustrated in the cross-sectional views of FIGS. 16–19.

Figure 16:
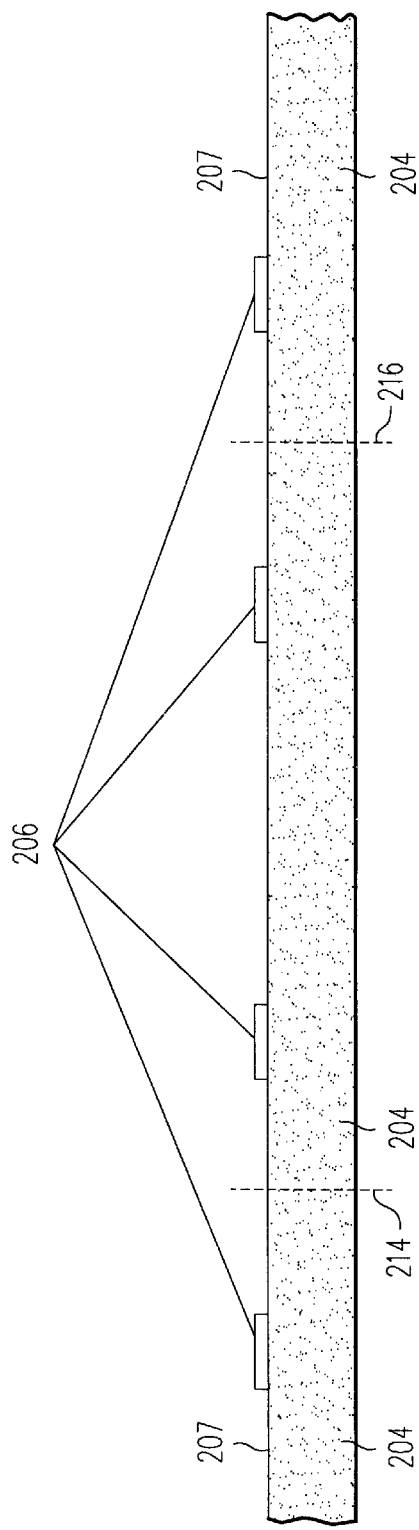

The manufacture of a flip-chip embodiment of the CS-BGA package 200 of the present invention is similar to that of the wire-bonded embodiment, and can be accomplished with automated equipment similar to that described above in connection with the wire-bonded embodiments, but with some notable differences. FIG. 16 illustrates a cross-sectional view of a region 112 of a semiconductor wafer similar to that shown in FIG. 5 including a plurality of adjacent chips 204. As in the wire-bonded embodiment, each chip 204 is bounded on all four sides by two orthogonal sets of scribe lines, or "streets," 214, 216, 218 and 220. In the cross-sectional views of FIGS. 16–19, the regions underlying the scribe lines 214, 216 on opposite sides of the chip 204 are shown as the dotted lines 214, 216.

The chip 204 has a plurality of connection pads 206 formed on a top, "active," surface 207 thereof. Unlike the wire-bonded embodiment, the location of the connection pads 206 is not limited to the periphery of the chip, but may extend across its entire top surface 207, i.e., chip componentry permitting.

Figure 17:
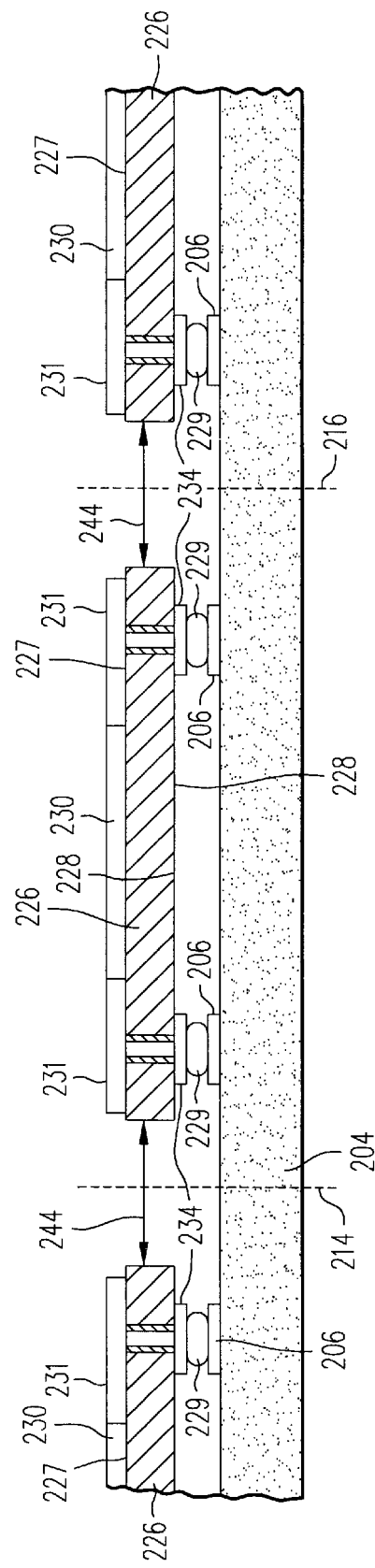

FIG. 17 illustrates the next stage in the fabrication procedure, the flip-chip attachment of the rigid substrates 226. Importantly, as in the wire-bonded embodiment, the material of the rigid, insulative substrate is selected to have a TCE that is the same, plus or minus about 2.5 PPM/° C., as the TCE of the underlying chip 204.

The "flip-chip" method of attachment of chips to substrates was developed by IBM, Inc., in about 1965. Sometimes referred to as the "Controlled Collapse Chip Connection," or "C4," method (see, e.g., L. F. Miller, "Controlled Collapse Reflow Chip Joining" *IBM J. Res. Develop.*, 239–250 (May 1969)), the technique conventionally involves forming balls 229 of a conductive metal, e.g., solder or gold, on the connection pads 206 on the active, upper surface 207 of the chip 204, then inverting, or "flipping" the chip upside-down, and fusing the conductive balls 229 to corresponding connection pads on a substrate.

However, in the method of the present invention, the chips 204 remain right-side-up (and integral to the wafer), and the rigid substrates 226 are provided with a plurality of connection pads 234 on their bottom surfaces 228 that correspond to respective ones of the connection pads 206 on the top surface 207 of the chips 204. As in the wire-bonded embodiment described above, the substrates 226 are positioned on their corresponding chips 204 such that the connection pads 234 on the substrates are aligned with their corresponding pads 206 on the chip, which placement can be effected rapidly and precisely with automated die pick-and-place equipment. However, rather than attaching the substrate to the chip with an adhesive, as described above, the conductive balls 229 between each pair of corresponding connection pads 234 and 206 are then fused, typically by a reflow method, which serves not only to interconnect the substrate 226 electrically with its corresponding chip 204, but also to attach the substrate to the chip mechanically, as shown in FIG. 17.

As in the wire-bonded embodiment 150, each substrate 226 has a plurality of metallizations, or conductive traces 230 formed on the top surface 227 thereof. Each conductive trace 230 comprises a contact pad or terminal 231 and a lead extending away from it. However, since the connection pads 234 are located on the bottom surface 228 of the substrate 226 in this embodiment, it is necessary to provide a conductive path through the thickness of the insulative substrate between the conductive traces 230 and the connection pads 234 to electrically interconnect the chip 204 with the contact terminals 231 on the top surface 227 of the substrate. This is accomplished by forming plated-through holes, or "vias," 242 in the substrate 226 between the connection pads 234 and the partial leads of the conductive traces 230 using known via-hole forming techniques adapted for use with ceramic materials.

As shown in FIGS. 17–19, each rigid substrate 226 has an area that is nearly the same as that of its corresponding chip 204, and is centrally located over its corresponding chip such that its edges are only slightly inboard of the edges of the chip, to leave only a narrow gap 244, typically about 2 mils wide, between the edges of adjacent substrates (see FIG. 17).

After the substrates 226 have been flip-chip attached and connected to their corresponding chips 204, as shown in FIG. 17, it is necessary to perform an encapsulation procedure on the assembly similar to that described above in connection with the wire-bonded embodiment, except that in the flip-chip embodiment, the surfaces and features to be protectively encapsulated are located entirely between the bottom surface 228 of the substrate 226 and the top, active surface 207 of the chip.

This stage of the fabrication is illustrated in FIG. 18, in which an "underfill" layer 246 of an epoxy resin encapsulant is formed between the two respective surfaces. The underfill layer 246 is formed by dispensing a very low-viscosity (about that of water at room temperature) epoxy resin, preferably Nagase R3002, available from Nase America Corp., New York, N.Y., into the gaps 244 between adjacent substrates and along the scribe lines 214, 216, 218 and 220 until the entire space between the bottom surface 228 of the substrate 226 and the top, active surface 207 of the chip 204 is completely filled with the underfill material.

In this regard, it may be desirable to form a temporary vertical dam, or barrier, (not illustrated) around the entire perimeter of the wafer to prevent the underfill encapsulant 246 from flowing off of the surface of the wafer at its perimeter until the encapsulant is cured. Penetration of the underfill encapsulant 246 between the substrate 226 and the chip 204 is aided by the capillary effect that exists between their opposing surfaces because of the very narrow distance between them (typically, about 4 mils), coupled with the low viscosity of the underfill encapsulant, which together, act to "wick" the encapsulant into the space to fill it completely. The underfill 246 serves not only to seal and protect the active surface 207 of the chip and the flip-chip interconnections 206, 229, 234 between the chip and the substrate from penetration by damaging moisture, but also to prevent shorting of the solder interconnects between each other and/or the collapse of the chip onto the substrate when the package 200 is surface-mounted to a main board by a high-temperature reflow soldering process that re-melts some or all of the chip-to-substrate interconnection balls 229.

The next stage of the fabrication of the flip-chip CS-BGA packages 200 in accordance with the present invention is illustrated in FIG. 19, wherein solder balls 236 are formed on each of the contact terminals 231 on the top surface 227 of the substrates 226. In a flip-chip CS-LGA and CS-LCC package 200, formation of the interconnecting solder balls 236 is omitted. Also, a second encapsulant 248, such as Hysol 4450, may optionally be dispensed at this stage into the narrow gap 244 between adjacent substrates 226 and above the underfill encapsulant 248, such that the gap 244 is entirely filled with the second material up the top surface 227 of the substrate. This second encapsulation 248 serves to "square-off" the corners of the packages 200 after they are singulated from the wafer so that, when the individual packages 200 are surface-mounted to a main board, no recess for the harmful entrapment of flux is created between the package and the board.

Singulation of the finished flip-chip CS-BGA, CS-LGA and CS-LCC packages 200 from the wafer is accomplished in the same manner as that of the wire-bonded embodiments described above, and results in the package 200 illustrated in enlarged cross-section in FIG. 3.

In accordance with the present invention, CS-BGA, CS-LGA and CS-LCC packages 200 are fabricated from chips while still in wafer form. This advantageously reduces the amount of handling necessary to form the individual CS packages, which substantially reduces manufacturing costs. And, by closely matching the TCEs of the rigid substrate and the chip, the compliant, "interposer" layer used in conventional μBGAs is eliminated, yet in a CS package that is relatively immune to temperature-related stress problems. Elimination of the interposer layer further reduces not only the manufacturing cost of the packages, but also the thermal resistance between the chip and the substrate.

Although the present invention has been described with reference to certain preferred embodiments, persons skilled in the art will recognize that many modifications may be made to these in terms of their materials and methods without departing from the spirit and scope of the invention. Thus, the scope of this invention should not be defined by that of the embodiments described and illustrated herein, but rather, by that of the following claims.

What is claimed is:

1. A method of manufacturing a chip-sized (CS) semiconductor package from an chip having a given thermal coefficient of expansion (TCE) and a plurality of contacts disposed on a top surface thereof, the method comprising:

mounting an insulative substrate on the top surface of the chip, the rigid substrate having a plurality of conductors formed on a top surface thereof and a TCE equal to the TCE of the chip, plus or minus about 2.5 parts-per-million per degree centigrade (PPM/° C.);

electrically connecting first terminals of the plurality of conductors on the substrate to the contacts on the chip with conductive connectors; and, encapsulating the contacts on the chip, the first terminals on the substrate, and the conductive connectors with a protective encapsulant.

2. The method of claim 1, further comprising forming contact bumps on second terminals of the plurality of conductors on the substrate.

3. The method of claim 2, wherein each conductor comprises one of the first terminals integrally connected to one of the second terminals.

4. The method of claim 1, wherein the substrate comprises a ceramic material.

5. The method of claim 1, wherein the substrate has an area that is less than the area of the chip.

6. The method of claim 5, wherein mounting the substrate on the top surface of the chip comprises mounting the substrate to a central area of the top surface of the chip such that the contacts on the chip are exposed outboard of edges of the chip.

7. The method of claim 1, wherein the semiconductor package has an area that is the same as that of the chip.

8. The method of claim 1, wherein mounting the substrate on the chip comprises bonding the substrate to the chip with an adhesive.

9. The method of claim 8, wherein bonding the substrate to the chip with an adhesive comprises:
applying the adhesive to a bottom surface of the rigid substrate; and,
placing the bottom surface of the rigid substrate on the top surface of the chip.

10. The method of claim 8, wherein bonding the substrate to the chip with an adhesive comprises:
applying the adhesive to the top surface of the chip; and,
placing the rigid substrate on the top surface of the chip.

11. The method of claim 1, wherein the chip comprises a die in a semiconductor wafer, and further comprising cutting the chip from the wafer after encapsulating the contacts on the chip, the first terminals on the substrate, and the conductive connectors with a protective encapsulant.

12. The method of claim 1, wherein the first terminals of the plurality of conductors are located on the top surface of the substrate, and wherein electrically connecting the first terminals of the conductors to the contacts on the chip comprises wire bonding the first terminals to the contacts.

13. The method of claim 1, wherein the first terminals of the plurality of conductors are located on a bottom surface of the substrate and at positions corresponding to the positions of the contacts on the chip, and wherein electrically connecting the first terminals of the conductors to the contacts on the chip comprises fusing a ball of a conductive metal between the first terminals and the contacts.

14. The method of claim 12, wherein encapsulating the contacts on the chip, the first terminals on the substrate, and the conductive connectors with a protective encapsulant comprises dispensing a bead of a viscous epoxy over the plurality of contacts, the plurality of connectors and the first terminals.

15. The method of claim 13, wherein encapsulating the contacts on the chip, the first terminals on the substrate, and the conductive connectors with a protective encapsulant comprises filling a space defined between the bottom surface of the substrate and the top surface of the chip with a low-viscosity epoxy underfill that encloses the plurality of contacts, the plurality of connectors and the first terminals.

16. A method of manufacturing a chip-size (CS) ball grid array (BGA), land grid array (LGA), or leadless chip carrier (LCC) semiconductor package from a semiconductor wafer, comprising:
forming dies in the wafer, each the die being bounded by scribe lines, having a thermal coefficient of expansion (TCE), and a top surface with a plurality of contacts thereon;
mounting an insulative substrate on each of the die top surfaces, each of the substrate having a plurality of conductors formed on a top surface thereof and a TCE equal to the TCE of the dies, plus or minus 2.5 PPM/° C.;
electrically connecting first terminals of the plurality of conductors to the contacts with a plurality of electrically conductive connectors;
encapsulating the plurality of contacts, the plurality of connectors and the first terminals with a protective encapsulant; and,
cutting the wafer along the scribe lines to singulate the dies into individual packages.

17. The method of claim 16, wherein the packages manufactured are CS-BGA packages, and further comprising forming solder balls on second terminals of the conductors located on the top surface of the substrate.

18. A chip-size (CS) semiconductor package, comprising:
a semiconductor chip having a top surface with a plurality of contacts formed thereon and a thermal coefficient of expansion (TCE);
an insulative substrate mounted to the top surface of the chip, the substrate having a TCE equal to the TCE of the chip, plus or minus about 2.5 parts-per-million per degree Centigrade (PPM/° C.);
a plurality of conductors disposed on the substrate, the conductors having first terminals formed integrally therein;
a plurality of conductive connectors electrically connecting the first terminals on the substrate to the contacts on the chip; and,
a protective layer of encapsulant covering the contacts, the connectors and the first terminals.

19. The CS semiconductor package of claim 18, wherein the conductors further comprise second terminals formed integrally therein on the top surface of the substrate, and further comprising a plurality of electrically conductive contact bumps formed on respective ones of the second terminals.

20. The CS semiconductor package of claim 18, wherein the insulative substrate comprises a ceramic, silicon oxide, G.A.S. quartz, alumina, aluminum nitride (AlN), or a laminate of one or more layers of the foregoing materials.

21. The CS semiconductor package of claim 18, wherein:
the substrate has an area less than the area of the chip and is mounted to a central area of the top surface of the chip inwardly of the contacts;
the first terminals are formed on the top surface of the substrate; and,
the conductive connectors comprise bonding wires electrically connecting the first terminals on the substrate to the contacts on the chip.

22. The CS semiconductor package of claim 18, wherein:
the substrate has an area nearly equal to the area of the chip;
the first terminals are formed on the bottom surface of the substrate at positions corresponding to the positions of the contacts on the chip; and,
the conductive connectors comprise fused balls of a conductive metal electrically connecting the first terminals on the substrate to the contacts on the chip.

* * * * *